United States Patent
Liu et al.

(10) Patent No.: US 10,127,052 B2
(45) Date of Patent: Nov. 13, 2018

(54) CONNECTION DEVICE FOR A MODULAR COMPUTING SYSTEM

(71) Applicant: Google Inc., Mountain View, CA (US)

(72) Inventors: Eric HC Liu, Redwood City, CA (US); Stephen Schooley, Menlo Park, CA (US); Kevin D. Brune, Maple Valley, WA (US)

(73) Assignee: Google LLC, Mountain View, CA (US)

( * ) Notice: Subject to any disclaimer, the term of this patent is extended or adjusted under 35 U.S.C. 154(b) by 307 days.

(21) Appl. No.: 15/130,360

(22) Filed: Apr. 15, 2016

(65) Prior Publication Data

US 2017/0300343 A1   Oct. 19, 2017

(51) Int. Cl.
| | |
|---|---|
| *H05K 5/02* | (2006.01) |
| *G06F 9/4401* | (2018.01) |
| *G06F 13/40* | (2006.01) |
| *G06F 1/16* | (2006.01) |

(Continued)

(52) U.S. Cl.
CPC .............. *G06F 9/4411* (2013.01); *G06F 1/16* (2013.01); *G06F 13/102* (2013.01); *G06F 13/385* (2013.01); *G06F 13/4081* (2013.01); *H05K 5/026* (2013.01); *H05K 5/0256* (2013.01); *H05K 5/0282* (2013.01)

(58) Field of Classification Search
CPC ........ G06F 1/163; G06F 1/188; G06F 9/4411; G06F 9/385; G06F 13/102; G06F 13/385; G06F 2200/1635; H05K 5/026; H05K 5/0256; H05K 5/0282
See application file for complete search history.

(56) References Cited

U.S. PATENT DOCUMENTS

| | | |
|---|---|---|
| 6,069,911 A | 5/2000 | Sealander et al. |
| 6,282,561 B1 | 8/2001 | Jones et al. |
| 6,771,595 B1 | 8/2004 | Gilbert et al. |

(Continued)

FOREIGN PATENT DOCUMENTS

| | | |
|---|---|---|
| EP | 2749200 | 7/2014 |
| GB | 2541796 | 1/2017 |
| WO | WO 2016/105930 | 6/2016 |

OTHER PUBLICATIONS

Great Britain Search Report dated May 30, 2017 for GB1621333.2, 4 pages.

*Primary Examiner* — Ernest Unelus
(74) *Attorney, Agent, or Firm* — Dority & Manning, P.A.

(57) ABSTRACT

Systems and methods of controlling operation of a connection device associated with a modular computing system are disclosed. For instance, data indicative of a connection between a first connection device and a second connection device can be obtained. The first connection device can be associated with a modular computing device, and the second connection device can be associated with a modular component to be implemented within the modular computing device. Each connection device can include a plurality of connector elements. Data indicative of one or more configuration parameters of the second connection device can be obtained. An operating configuration of the first connection device can be determined based at least in part on the data indicative of the one or more configuration parameters. Operation of the first connection device can be controlled based at least in part on the operating configuration.

15 Claims, 5 Drawing Sheets

(51) Int. Cl.
*G06F 13/10* (2006.01)
*G06F 13/38* (2006.01)

(56) References Cited

U.S. PATENT DOCUMENTS

| | | | |
|---|---|---|---|
| 6,785,889 B1 | 8/2004 | Williams |
| 6,941,399 B2 | 9/2005 | Loh |
| 6,961,575 B2 | 11/2005 | Stanforth |
| 6,968,323 B1 | 11/2005 | Barisal et al. |
| 6,975,613 B1 | 12/2005 | Johansson |
| 7,009,939 B2 | 3/2006 | Baker et al. |
| 7,043,225 B1 | 5/2006 | Patel et al. |
| 7,058,387 B2 | 6/2006 | Kumar et al. |
| 7,184,759 B2 | 2/2007 | Date et al. |
| 7,257,632 B2 | 8/2007 | Zhang et al. |
| 7,340,759 B1 | 3/2008 | Rodriguez |
| 7,346,354 B2 | 3/2008 | Patel |
| 7,463,890 B2 | 12/2008 | Herz et al. |
| 7,489,656 B2 | 2/2009 | Guo et al. |
| 7,689,681 B1 | 3/2010 | David |
| 7,720,968 B2 | 5/2010 | Clark, Jr. et al. |
| 7,788,133 B2 | 8/2010 | Delenda |
| 8,027,684 B2 | 9/2011 | Gupta et al. |
| 8,028,057 B2 | 9/2011 | David |
| 8,156,500 B2 | 4/2012 | Helander |
| 8,185,909 B2 | 5/2012 | Sigal et al. |
| 8,249,984 B2 | 8/2012 | Dawson et al. |
| 8,276,143 B2 | 9/2012 | Vengerov et al. |
| 8,296,770 B2 | 10/2012 | Ohno |
| 8,320,414 B2 | 11/2012 | Dawson et al. |
| 8,355,670 B2 | 1/2013 | White |
| 8,424,007 B1 | 4/2013 | Hernacki et al. |
| 8,520,535 B2 | 8/2013 | Dawson et al. |
| 8,667,065 B1 | 3/2014 | Odom |
| 8,694,968 B2 | 4/2014 | Eteminan et al. |
| 8,730,994 B2 | 5/2014 | Kannan et al. |
| 8,782,211 B1 | 7/2014 | Sharma |
| 9,003,039 B2 | 4/2015 | Amotim |
| 9,015,708 B2 | 4/2015 | Choudhury et al. |
| 9,031,531 B2 | 5/2015 | Miluzzo et al. |
| 9,037,508 B2 | 5/2015 | Dawson et al. |
| 9,038,195 B2 | 5/2015 | Satpathy et al. |
| 9,075,659 B2 | 7/2015 | Barzel et al. |
| 9,078,274 B2 | 7/2015 | Guo |
| 9,083,819 B2 | 7/2015 | Chan et al. |
| 9,118,750 B2 | 8/2015 | Vossoughi et al. |
| 9,148,473 B1 | 9/2015 | Sharma |
| 9,229,781 B2 | 1/2016 | Karaoguz et al. |
| 9,241,304 B2 | 1/2016 | Dawson et al. |
| 2002/0058499 A1 | 5/2002 | Ortiz |
| 2003/0139199 A1 | 7/2003 | Kinnula et al. |
| 2003/0217129 A1 | 11/2003 | Knittel et al. |
| 2004/0111308 A1 | 6/2004 | Yakov |
| 2004/0128262 A1 | 7/2004 | Nafousi |
| 2004/0156312 A1 | 8/2004 | Salonidis et al. |
| 2004/0165548 A1 | 8/2004 | Backes |
| 2004/0203820 A1 | 10/2004 | Billhartz |
| 2006/0007955 A1 | 1/2006 | Kotzin |
| 2006/0167784 A1 | 7/2006 | Hoffberg |
| 2007/0230421 A1 | 10/2007 | Roadknight |
| 2007/0294692 A1 | 12/2007 | Zhao et al. |
| 2008/0040481 A1 | 2/2008 | Joshi et al. |
| 2008/0298284 A1 | 12/2008 | Dawson et al. |
| 2008/0298314 A1 | 12/2008 | Dawson et al. |
| 2008/0300890 A1 | 12/2008 | Dawson et al. |
| 2008/0301017 A1 | 12/2008 | Dawson et al. |
| 2008/0313642 A1 | 12/2008 | Karaogtrz et al. |
| 2009/0025004 A1 | 1/2009 | Barnard et al. |
| 2009/0180430 A1 | 7/2009 | Fadell |
| 2009/0228888 A1 | 9/2009 | Vengerov et al. |
| 2009/0271324 A1 | 10/2009 | Jandhyala et al. |
| 2010/0223385 A1 | 9/2010 | Gulley et al. |
| 2010/0251259 A1 | 9/2010 | Howard |
| 2010/0332262 A1 | 12/2010 | Horvitz et al. |
| 2011/0288905 A1 | 11/2011 | Mrakas |
| 2011/0320233 A1 | 12/2011 | Arnette et al. |
| 2012/0079097 A1 | 3/2012 | Gopisetty et al. |
| 2012/0324111 A1 | 12/2012 | Barzel et al. |
| 2013/0042004 A1 | 2/2013 | Boss et al. |
| 2014/0067496 A1 | 3/2014 | Buswell |
| 2014/0195683 A1 | 7/2014 | Ammerman, III et al. |
| 2014/0307635 A1 | 10/2014 | Agrawal et al. |
| 2015/0026336 A1 | 1/2015 | Suchter et al. |
| 2015/0067022 A1 | 3/2015 | Subbiah |
| 2015/0074635 A1 | 3/2015 | Margiotta et al. |
| 2015/0195011 A1 | 7/2015 | Birgel et al. |
| 2015/0206228 A1 | 7/2015 | Perez et al. |
| 2015/0223355 A1* | 8/2015 | Fleck .............. H05K 5/026 361/679.03 |

\* cited by examiner

CONNECTION DEVICE FOR A MODULAR COMPUTING SYSTEM

FIELD

The present disclosure relates generally to modular computing devices, and more particularly to connection devices associated with a modular computing device.

BACKGROUND

Modular systems such as a modular computing system can have multiple different modular electronic components. Modular components can be removable, replaceable, and/or interchangeable. In general, different modular components of a modular device or system can be capable of performing different functions, including a specialized function and/or one or more general functions.

As an example, specialized modular components can perform one or more specific functions using one or more specific resources. Examples of specialized modular components includes a camera modular component, a battery modular component, or other modular component configured to perform a particular task. Thus, in some examples, the specific functions can include capturing an image, supplying power, or performing a specific function using special hardware (e.g., performing a cryptographic function, a graphics processing function, etc.).

Other modular components can have the capability to perform general functions using their general resources, such as a memory and a processor. For example, modular components can have the ability to communicate with an external modular component or device (e.g., through a hardwired connection or using a wireless connection). Examples of general functions include performing a processing task, storing data in memory, or utilizing communication bandwidth.

Modular components can be combined with other modular components or devices. In some examples, such combination can utilize physical combination, for example, by attaching modular components to each other or a common structure. For example, a processing modular component from a modular phone can be removably physically combined with an interface modular component (e.g., HDMI or USB) to provide video-playback functionality. In other examples, combinations of modular components can include physically unconnected devices, such as, for example, modular components that are communicatively connected over one or more wireless communication links.

SUMMARY

Aspects and advantages of embodiments of the present disclosure will be set forth in part in the following description, or may be learned from the description, or may be learned through practice of the embodiments.

One example aspect of the present disclosure is directed to a computer-implemented method of controlling operation of a connection device associated with a modular computing device. The method includes obtaining, by the one or more computing devices, data indicative of a connection between a first connection device and a second connection device. The first connection device is associated with a modular computing device. The second connection device is associated with a modular component to be implemented within the modular computing device. Each connection device includes a plurality of connector elements. The method further includes obtaining, by the one or more computing devices, data indicative of one or more configuration parameters associated with the second connection device. The method further includes determining, by the one or more computing devices, an operating configuration of the first connection device based at least in part on the data indicative of the one or more configuration parameters associated with the second connection device. The method further includes controlling, by the one or more computing devices, operation of the first connection device based at least in part on the operating configuration.

Other example aspects of the present disclosure are directed to systems, apparatus, tangible, non-transitory computer-readable media, user interfaces, memory devices, and electronic devices for controlling operation of a connection device associated with a modular computing device.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
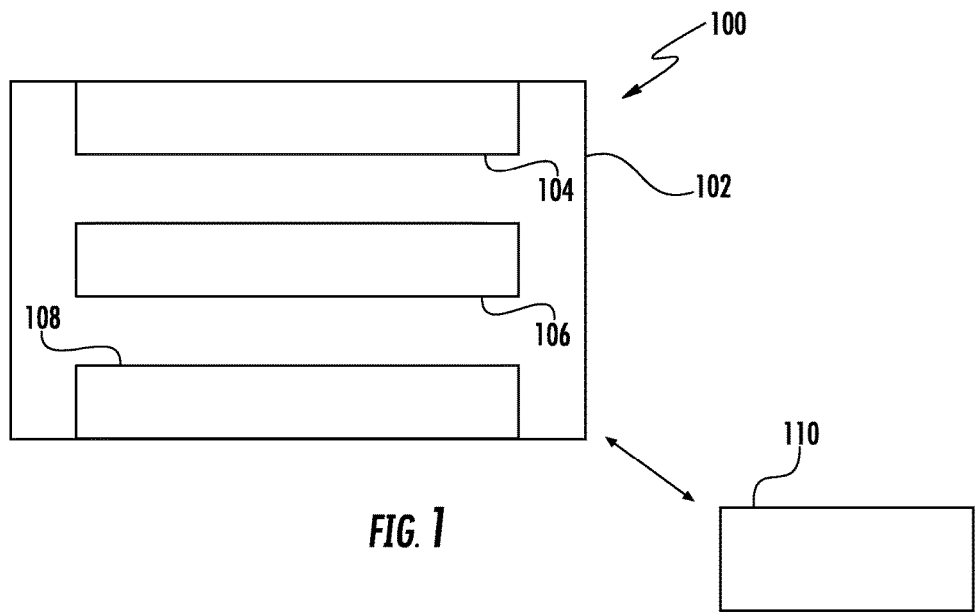
FIG. 1 depicts an example modular computing system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to configuring connection devices for use in a modular computing environment. For instance, a connection between a first connection device and a second connection device can be detected. The first connection device can be associated with a modular computing device, and the second connection device can be associated with a modular component configured to interface with the modular computing device. Each connection device can include a plurality of individually configurable connector elements that include at least one antenna element and a plurality of connector pins. Data indicative of one or more configuration parameters associated with the second connection device can be obtained, and an operating configuration of the first connection device can be determined based at least in part on the detected connection and the configuration parameters of the second connection device. Operation of the first connection device can then be controlled based at least in part on the determined operating configuration.

More particularly, the modular computing device can be configured to interface with one or more modular components and to perform one or more operations using the functionality of the one or more modular components. Each modular component can have one or more capabilities or functions that can be implemented by the modular computing device. For instance, a modular component can have a display screen function, an image capture function, a power function, and/or various other suitable capabilities or functions. In some implementations, a modular component may have capabilities or functions that can contribute to other modular components within the modular computing environment. For instance, a modular component can include memory to be added to a total device memory, processing capability to be added to a total device processing capability, battery storage to be added to a total device battery storage, etc.

As indicated, each connection device can include a connector array having a plurality of connector elements. The connector elements can include an antenna element, and a plurality of connector pins. The antenna element can be a metal wire, filament, stub, or other element. The antenna element can be configured to communicate using one or more wireless communication techniques, such as near-filed radio frequency (RF) communication or other communication technique. In this manner, the antenna element can be configured to transmit and/or receive data over one or more frequency ranges. The connector pins can be configured to conduct power signals. For instance, a connector pin of a first connector element of a first connection device can conduct power to or from a corresponding connector pin of a second connector element of a second connection device. In some implementations, at least one connector pin can be an insulating and/or grounding pin.

As described above, a first connection device associated with a modular computing device can connect with a second connection device associated with a modular component. In some implementations, the connection can be at least in part a physical connection wherein at least one connector pin of the first connection device makes physical contact with a corresponding connector pin of the second connection device. For instance, in implementations wherein integration of a modular component within a modular computing device requires a transfer of power, at least one connector pin pair of the first and second switching devices can transfer power signals via a physical connection. A physical connection can be made by positioning the modular component within a receptacle of a frame or skeleton of the modular computing device, such that at least a portion of the first and second connection devices align. In some implementations, the physical connection can be facilitated by one or more latching structures, such as one or more connector housings, latches, catches fitting sleeves, or other suitable structure.

In some implementations, antenna element pairs of the first and second connection devices may not require a physical connection for data communication. In this manner, the antenna elements may be positioned such that no physical contact is made when the first connection device is connected to the second connection device. For instance, in implementations wherein the antenna elements communicate using near-field communication techniques, the antenna elements can be positioned within a range of about 1 millimeter (mm) to about 10 mm from each other. As used herein, the term "about," when used in conjunction with a numerical reference is intended to refer to within 40% of the numerical reference.

In implementations wherein power transfer is not required and/or wherein the antenna element pair communicates using a communication technique that has a longer range, a physical connection may not be required. For instance, in such implementations, a connection can be made, and the capabilities and/or functions of the modular component can be implemented in or by the modular computing device without a physical connection between the connection devices.

In some implementations, a connection can be made between first and second connection devices having connector arrays that do not completely align or otherwise match. For instance, in some implementations, a connector element of the second connection device may not be required to connect to a particular connector element of the first connection device. Similarly, in some implementations, the connector array of the second connection device may not be required to align perfectly with the connector array of the first connection device. In particular, the connector array of the first connection device may include more connector elements than the connector array of the second connection device, such that at least one connector element of the first connection device does not have a corresponding connector element of the second device when connected. In this manner, a connection can be made although only a subset of connector elements of the first connection device is connected.

Once a connection is detected, operation of the first connection device can be controlled based at least in part on the second connection device. In particular, once a connection is made, the connection can be detected, and data indicative of the connection can be obtained, or otherwise determined. For instance, upon detection of a connection, data indicative of the connected connector elements of the first and second connection devices can be obtained. As indicated, the connected connector elements can include at least a subset of the connector elements of the connector array of each connection device. The data indicative of the connection can include an identifier associated with each connected connector element of the first and second connection devices.

Data associated with one or more configuration parameters of the second connection device can further be obtained. The configuration parameters can include one or more tasks or capabilities associated with the connected connector elements of the second connection device. For instance, the tasks or capabilities can include one or more signal types to be communicated by the connected connector elements. The signal types can include power signals and/or data signals. In this manner, the configuration parameters can specify whether each connected connector element will conduct power signals, communicate (e.g. transmit and/or receive) data signals, or both. In some implementations, one or more data signal types can be further specified by the configuration parameters. For instance, the configuration parameters can indicate that the connector element will communicate high frequency data signals (e.g. for video, images, touchscreen position data, etc.), and/or low frequency data signals (e.g. for various other suitable types of data).

One or more operating configurations of the first connection device can be determined based at least in part on the data indicative of the connection, and the one or more configuration parameters of the second connection device. The operating configurations can specify one or more tasks to be performed by the first connection device. In particular, the modular computing device can configure the connected connector elements of the first connection device based at least in part on the configuration parameters of the corresponding connector elements of the second connection device. As an example, if a connector element of the second connection device is configured to only communicate low frequency data signals, the corresponding connector element of the first connection device can also be configured to communicate low frequency data signals. In particular, the modular computing device can deactivate the connector pins of the connector element, activate the antenna element, and set the antenna element up for low frequency data communication. As another example, if a connector element of the second connection device is configured only to receive power signals on a subset of connector pins, the modular computing device can deactivate the antenna element, and activate the connector pins corresponding to the subset. In this manner, operation of the first connection device can be controlled to accommodate a plurality of second connection devices having a plurality of configurations.

The connection devices of the present disclosure are discussed with regard to their use in modular computing environments. However, those skilled in the art will appreciate that the example connection devices discussed herein can be used in a number of other suitable computing environments without deviating from the scope of the present disclosure. In particular, the connection devices of the present disclosure can be implemented in various computing devices that do not contain modular features or functionalities as described herein.

With reference now to the figures, example embodiments of the present disclosure will be discussed in greater detail. For instance, FIG. 1 depicts an example modular computing device 100. Device 100 can be a user computing device capable of being carried by a user while in operation. In particular, device can include electronic and/or mechanical features supporting various functionalities, such as data communication, computing, processing data, graphical display, telephone calls, video calls, media output, sensing environment conditions, notifications, scheduling and/or various other suitable functionalities.

Device 100 can include a frame 102 and a plurality of modular components 104, 106, 108, 110. As depicted, modular components 104-108 can be configured to connect to modular computing device 100 via physical connection with frame 102. Modular component 110 can be configured to connect to modular computing device 100 via wireless communication. In some implementations, modular components 104-108 can be configured to be positioned within various receptacles on one or more layers of frame 102. For instance, each modular component 104-108 can be configured to be slid in or out of a receptacle of frame 102.

As indicated above, modular components 104-110 can be configured to provide some functionality to modular computing device 100. For instance, each modular component 104-110 may contribute functions that are defined by the modular component itself, such as a display screen function, a camera function, a power function, and/or various other suitable functions. As another example, each modular component 104-110 may contribute functions that add to the functions of one or more other modular components associated with modular computing device 100. For instance, a modular component may be configured to add memory to a total device memory, processing capability to a total device processing capability, battery storage added to a total device battery storage, etc.

Frame 102 and modular components 104-110 can include one or more connection devices configured to enable a connection (e.g. physical connection and/or wireless connection) with a mating connection device. In particular, frame 102 may include a plurality of connection devices to enable connections with a plurality of modular components.

Figure 2:
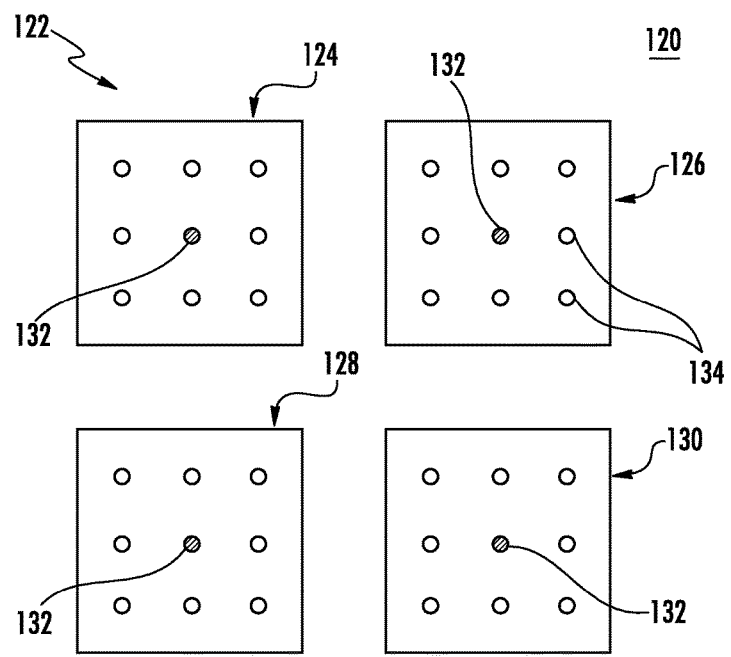
FIGS. 2-3 depict example connector arrays according to example embodiments of the present disclosure.

For instance, FIG. 2 depicts a portion of an example connection device 120 according to example embodiments of the present disclosure. In particular, FIG. 2 depicts a connector array 122 of connection device 120. A connection device can include one or more connector arrays. Connector array 122 includes connector elements 124, 126, 128, and 130. Each connector element 124-130 can include an antenna element 132 and a plurality of connector pins 134. As indicated antenna elements 132 can be a metal wire, filament, stub, or other suitable antenna element. In some implementations, each antenna element 132 can be configured for wireless communication with an antenna element in a mating connection device of connection device 120. For instance, if connection device 120 is implemented within frame 102 of FIG. 1, one or more antenna elements 132 can be configured to communicate with a corresponding antenna element on a mating connection device implemented within a modular component.

In some implementations, antenna elements 132 can be configured to communicate using near field communication, or other wireless communication technique. In some implementations, the length of the antenna element may not be tuned based on the frequency of the broadcast data signal. In such implementations, the broadcast data signal can be broadcast over a wideband frequency range and can have a broadcast power and/or signal-to-noise ratio below a required limit in broadcast power. In this manner, the power of the signal can be sufficient to ensure that the corresponding antenna element on the mating connection device can receive the signal at a designated distance from the broadcasting antenna element.

Connector elements 124-130 can further include connector pins 134 surrounding the antenna element 132. Connector pins 134 can be configured to make physical contact with corresponding connector pins of a mating connection device. Connector pins 134 can include one or more conduction pins and/or one or more grounding or insulating pins. In some implementations, one or more conduction pins can conduct power signals to a mating connection device via physical contact with a corresponding conduction pin of the mating connection device. In some implementations, each connector pin 134 of a connector element can be a ground or insulating pin, such that no power signals are conducted by the connector element.

In some implementations a physical connection between a connector element and a corresponding connector element of a mating connection device can be facilitated by a connector housing associated with the connector element. For instance, the housing associated with a connector element can be a physical housing that surrounds and holds in place antenna element 132 and/or connector pins 134. In some implementations, the housing can include physical latches, catches, fitting sleeves, or other structure to further facilitate a connection between connection devices. In this manner, the housing can align an antenna element pair and one or more connector pin pairs of mating connection devices.

Figure 3:
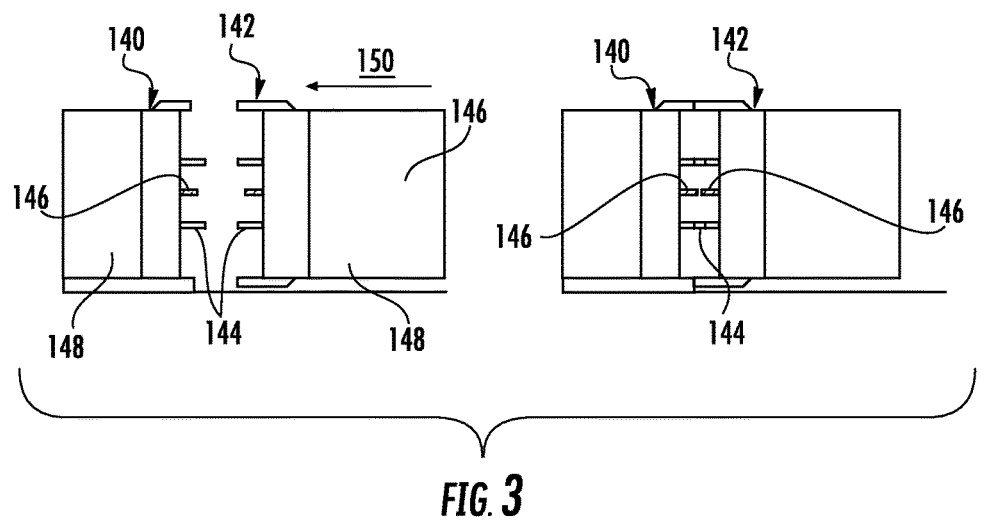

The connection devices of the present disclosure can be implemented within modular components and/or modular computing devices in various manners. For instance, FIG. 3 depicts example connection devices 140 and 142 according to example embodiments of the present disclosure. Connection devices 140, 142 can correspond to connection device 120 or other connection device. For instance, connection device 140 can be implemented within a modular computing device, and connection device 142 can be implemented within a modular component. As shown, a physical connection can be made between connection devices 140 and 142 by positioning the connection devices together. In particular, FIG. 3 depicts connection devices configured to form a physical connection or disconnection in a direction parallel to a direction of motion 150 of the connection device 142. In this manner, the connection can be made by sliding the modular component in direction of motion 150, and a disconnection can be made by sliding the modular component in the opposite direction.

As depicted in FIG. 3, a connection between connection devices 140 and 142 can include making physical contact between connector pins 144 of the connection devices. As antenna elements 146 are configured to transfer data wirelessly, physical contact need not be made between antenna elements. In particular, FIG. 3 depicts a gap between antenna elements 146 while connector pins 144 make physical contact. As the antenna elements 146 are not required to make contact, alignment between the antenna elements need not be as precise as in a scenario wherein physical contact between antenna elements is required. FIG. 3 further depicts housings 148 associated with each connection device 140, 142. As indicated above, housings 148 can be configured to align the connector elements of connection devices 140 and 142 when a connection is initiated.

Figure 4:
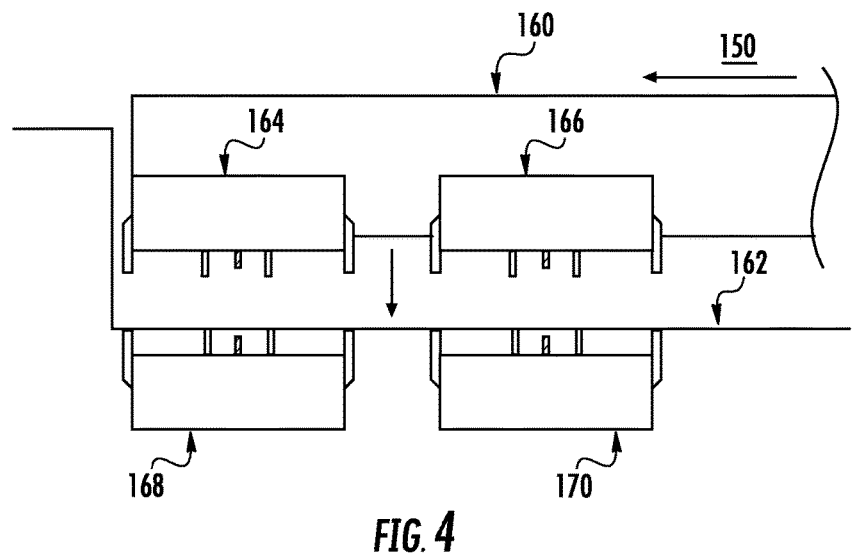
FIGS. 4-5 depict example connection devices according to example embodiments of the present disclosure.

FIG. 4 depicts an additional manner in which connection devices can be implemented. In particular, FIG. 4 depicts example connection devices 160, 162. Connection devices 160, 162 can correspond to connection device 120 or other suitable connection device. Connection device 160 can include connector elements 164 and 166, while connection device 162 can include connector elements 168 and 170. Connection device 160 can be a connection device implemented within a modular computing device, while connection device 162 can be a connection device implemented within a modular component. In particular, connection devices 160, 162 can be implemented in such a manner to facilitate a connection or disconnection in a direction perpendicular to direction of motion 150 of connection device 162. In this manner, the connection can be made by sliding the modular component in a direction of motion 150, and a disconnection can be made by sliding the modular component in the opposite direction.

It will be appreciated that the connection devices of FIGS. 2-4 are depicted for illustrative purposes only. In particular, the connection devices of the present disclosure can include various other suitable configurations, structures, shapes, etc. without deviating from the scope of the present disclosure. For instance, a connection device may include any suitable number of connector elements, antenna elements, connector pins, etc. In addition, a connection device may include various other configurations, such as a concentric configuration or other configuration.

Figure 5:
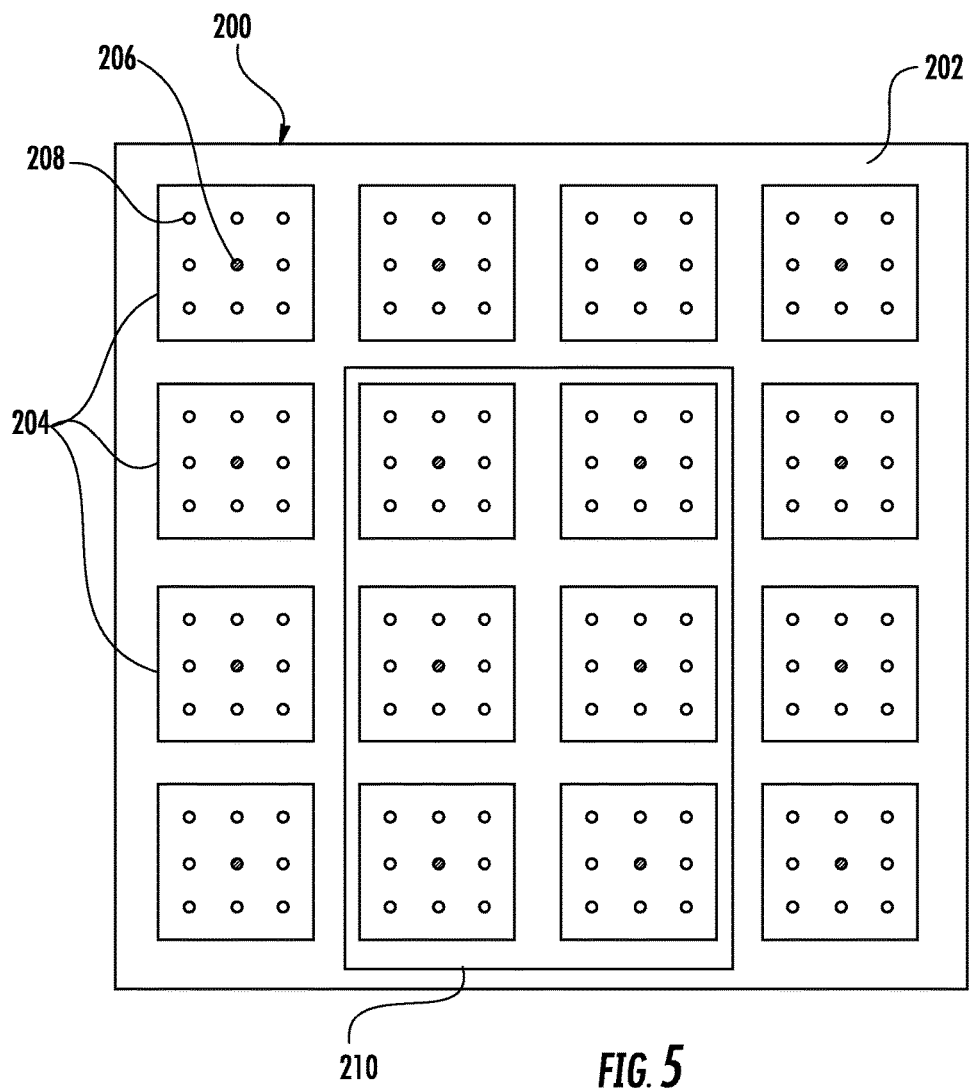

FIG. 5 depicts an example connection device 200 according to example embodiments of the present disclosure. Connection device 200 includes a connector array 202, and a plurality of connector elements 204, each having an antenna element 206 and a plurality of connector pins 208. As indicated above, the configuration of connection device 200 can be determined based at least in part on a mating connection device associated with connection device 200. In particular, a connection between connection device 200 and a mating connection device, such as connection device 210 can be detected. As shown, connection device 210 does not have the same connector element configuration as connection device 200. In this regard, a connection between connection device 200 and connection device 210 can be made although not every connector element of connection device 200 has a corresponding connector element on connection device 210. Accordingly, connection device 200 can be configured to connect to connection devices having various element configurations.

Upon detection of a connection, data indicative of the connection can be obtained or otherwise determined. For instance, the connected connector elements of connection device 200 can be determined. The connected connector elements can be connector elements of connection device 200 that are connected to corresponding connector elements of connection device 210. For instance, an identifier associated with each connected connector element can be determined. Operation of connection device 200 can then be controlled based at least in part on one or more configuration parameters of connection device 210. In particular, operation of connection device 200 can be controlled based at least in part on the configuration parameters of each connector element of connection device 210.

Each connector element of connection device 210 can have various capabilities and/or be configured to perform various tasks or operations. Each connector element may be independently configurable. In this manner, the configurations of the connector elements of a connection device are not required to match. For instance, a connector element may be configured to transmit power signals and/or data signals to a mating connector element. Further, a connector element may be configured to transmit low frequency data signals and/or high frequency data signals. In particular, data signals may be communicated by the antenna element of the connector element and power signals may be transmitted by one or more of the connector pins. In this manner, the configuration parameters of each connector element of connection device 210 can be identified, and the corresponding (e.g. mating) connector elements of connection device 200 can be configured based at least in part on the configuration parameters.

For instance, if a connector element of connection device 210 is configured to communicate only low frequency data signals, the corresponding connector element of connection device 200 can be configured to receive low frequency data signals. In particular, the antenna element of the connector element can be activated, and the conduction pins of the connector element can be deactivated, such that the connector element does not conduct power signals. As another example, if a connector element is configured to both conduct power signals and communicate data signals, the antenna element and the appropriate conductor pins of the corresponding connector element can be activated to enable the appropriate tasks to be performed. As yet another example, if it is determined that a connector element of connection device 200 does not have a corresponding connector element of connection device 210, the entire connector element can be deactivated. In this manner, operation of each connector element can be independently controlled to match the functions of a mating connector element.

Figure 6:
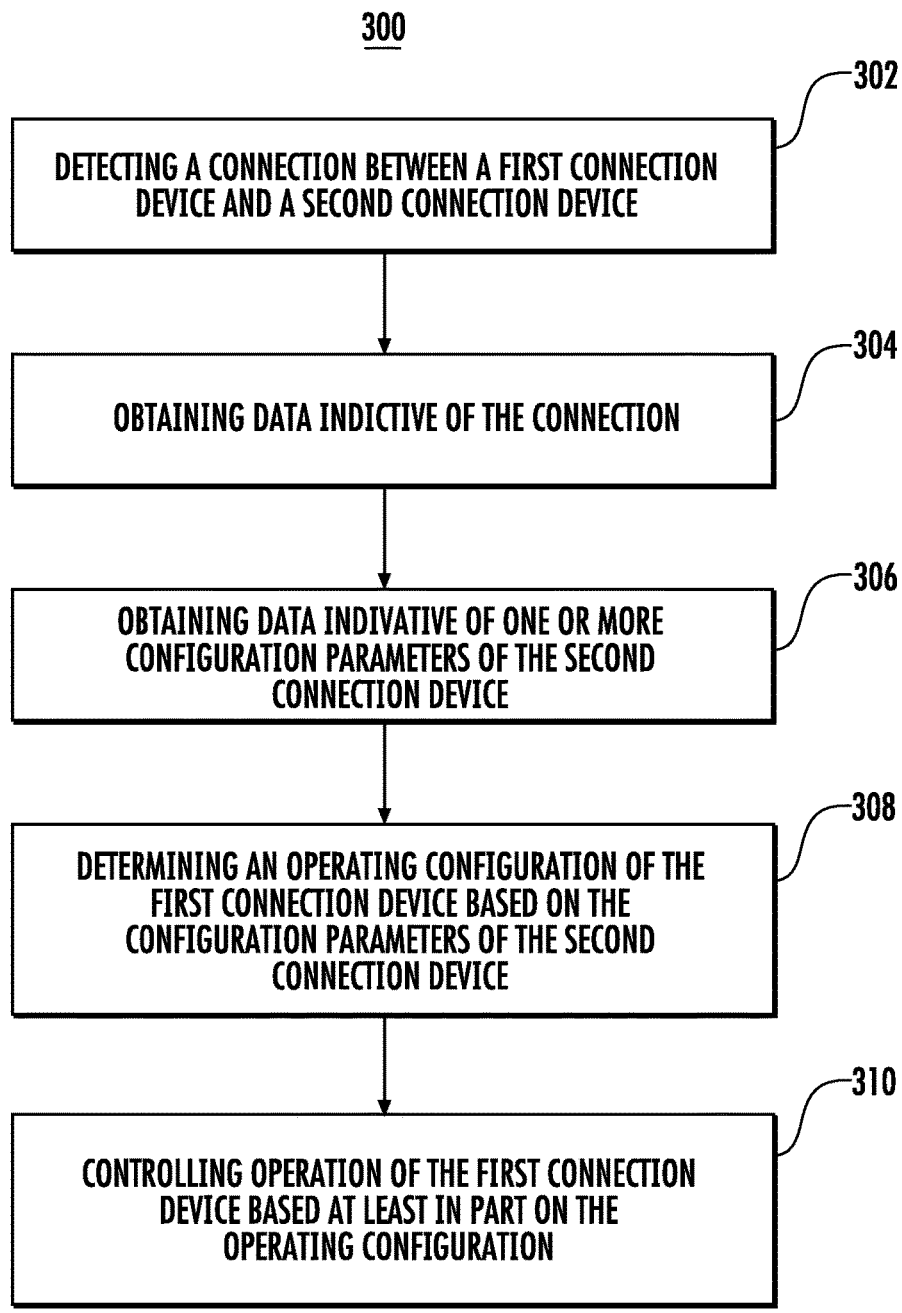
FIG. 6 depicts a flow diagram of an example method of controlling operation of a connection device associated with a modular computing system according to example embodiments of the present disclosure.

FIG. 6 depicts a flow diagram of an example method (300) of controlling operation of a connection device according to example embodiments of the present disclosure. Method (300) can be implemented by one or more computing devices, such as one or more of the computing devices depicted in FIG. 7. In addition, FIG. 6 depicts steps performed in a particular order for purposes of illustration and discussion. Those of ordinary skill in the art, using the disclosures provided herein, will understand that the steps of any of the methods discussed herein can be adapted, rearranged, expanded, omitted, or modified in various ways without deviating from the scope of the present disclosure.

At (302), method (300) includes detecting or otherwise identifying a connection between a first connection device and a second connection device. In particular, the first connection device can be implemented within a modular computing device and the second connection device can be implemented within a modular component to be associated with the modular computing device. The connected connection devices can be mating connection devices. As indicated above, the connection can be a physical connection, wherein physical contact is made between the connection devices, or a wireless connection wherein no physical contact is made. In some implementations, a physical connection can include physical contact by one or more connector pins associated with each connection device, while no physical contact is made between antenna elements associated with each connection device.

In some implementations, a connection can be detected by detecting a physical connection between devices. In some implementations, a connection can be detected by detecting wireless communication between devices. The wireless communication can be a direct wireless communication or a communication over a wireless network.

At (304), method (300) can include obtaining data indicative of the connection between the first and second connection devices. In some implementations, the data indicative of the connection can include data indicative of one or more connector elements of the first connection device that are connected to the second connection device. As indicated above, the connection devices need not perfectly match for a connection to be made. For instance, the data indicative of the connection can include identifiers associated with the connected connector elements, and obtaining the data indicative of the connection can include identifying, determining, or otherwise obtaining the identifiers. As indicated, in various implementations, the connected connector elements can include a subset of connector elements of the first connection device, or every connector element of the first connection device.

At (306), method (300) can include obtaining data indicative of one or more configuration parameters associated with the second connection device. As indicated above, the configuration parameters can include data indicative of one or more capabilities associated with, or tasks to be performed by each connected connector element of the second connection device. For instance, as with the first connection devices, the connected connector element of the second connection device can include a subset of connector elements or every connector element of the second connection device.

The configuration parameters can provide an indication of a function of the connected connector elements. For instance, the configuration parameters can indicate whether a connector element will transmit data signals (e.g. low frequency data signals and/or high frequency data signals) and/or conduct power signals. In this manner, the configuration parameters can provide an indication of how the first connection device is to be configured to match the functionalities of the second connection device.

At (308), method (300) can include determining an operating configuration of the first connection device based at least in part on the configuration parameters of the second connection device. In particular, determining an operating configuration of the first connection device can include determining operating configurations of each connected connector element of the first connection device. In this manner, the operating configuration can include configuration determinations for each pin and/or antenna element of each connected connector device. For instance, operating configurations can include a determination of whether to activate or deactivate each pin and element based on the configuration parameters of the second connection device. In some implementations, the operating configuration can further include determining operating configuration for the non-connected connector elements of the first connection device. For instance, the operating configuration can include a determination to deactivate each non-connected connector element.

At (310), method (300) can include controlling operation of the first connection device based at least in part on the operating configuration. For instance, controlling operation of the first connection device can include activating or deactivating at least a portion of one or more connector elements based at least in part on the operating configuration. Controlling operation of the first connection device in this manner will enable the connection devices to interface to achieve a computing operation associated with the modular computing device. For instance, the connection devices can begin communicating the appropriate signals (e.g. power signals, data signals, etc.) over the appropriate channels (e.g. pins, antenna elements) to achieve the computing operation.

Figure 7:
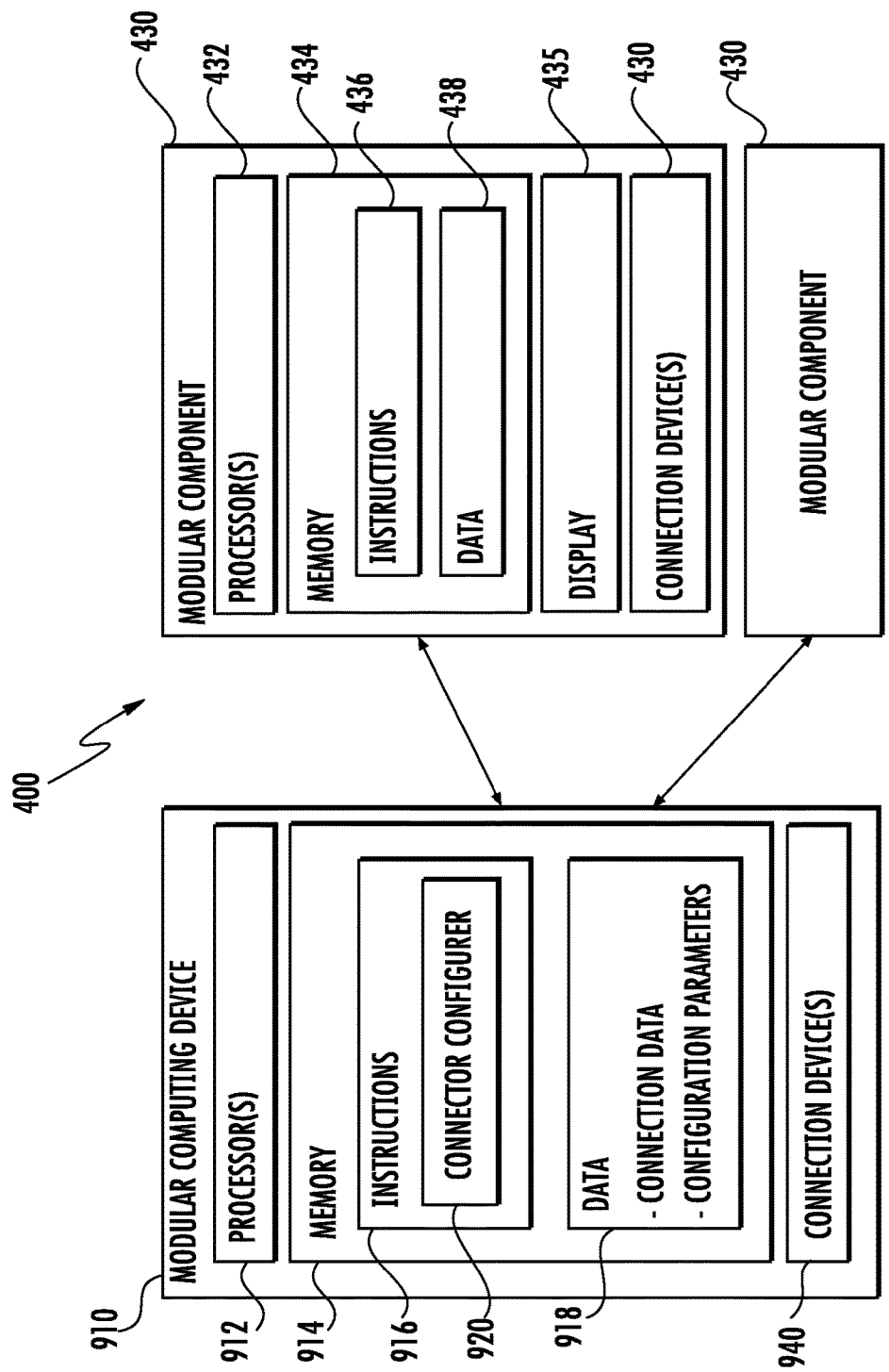
FIG. 7 depicts an example system according to example embodiments of the present disclosure.

FIG. 7 depicts an example computing system 400 that can be used to implement the methods and systems according to example aspects of the present disclosure. The system 400 can be implemented using other suitable architectures, such as a single computing device.

The system 400 includes a modular computing device 410. The modular computing device 410 can be implemented using any suitable computing device(s). In various implementations, the modular computing device 410 can be configured to receive one or more modular components, such as modular component 430 to add to the functionality of modular computing device 410. In some implementations, the modular computing device 410 can have one or more processors 412 and one or more memory devices 414. The modular computing device 410 can also include a network interface used to communicate with one or more modular components 430 over a network. The network interface can include any suitable components for interfacing with one more networks, including for example, transmitters, receivers, ports, controllers, antennas, or other suitable components.

In some implementations, processor(s) 412, memory devices 414, the network interface, and/or various other suitable devices or components associated with modular computing device 410 can be implemented within modular computing device 410 by one or more modular components 430. For instance, a first modular component 430 may contribute processing capabilities, while a second modular component may contribute memory.

The one or more processors 412 can include any suitable processing device, such as a microprocessor, microcontroller, integrated circuit, logic device, or other suitable processing device. The one or more memory devices 414 can include one or more computer-readable media, including, but not limited to, non-transitory computer-readable media, RAM, ROM, hard drives, flash drives, or other memory devices. The one or more memory devices 414 can store information accessible by the one or more processors 412, including computer-readable instructions 416 that can be executed by the one or more processors 412. The instructions 416 can be any set of instructions that when executed by the one or more processors 412, cause the one or more processors 412 to perform operations. For instance, the instructions 416 can be executed by the one or more processors 412 to implement a connector configurer 420. Connector configurer can be configured to detect a connection between a connection device associated with modular computing device 410 and a connection device associated with modular component 430.

As shown in FIG. 7, the one or more memory devices 414 can also store data 418 that can be retrieved, manipulated, created, or stored by the one or more processors 412. The data 418 can include, for instance, connection data, configuration parameters, and other data. The data 418 can be stored in one or more databases. The one or more databases can be connected to the modular computing device 410 by a high bandwidth LAN or WAN, or can also be connected to modular computing device 410 through a network. The one or more databases can be split up so that they are located in multiple locales.

The modular computing device 410 can exchange data with one or more modular components 430 over the network 440. Although two modular components 430 are illustrated in FIG. 7, any number of modular components 430 can be connected to the modular computing device 410 over the network 440. Each of the modular components can include functionality that can be contributed to modular computing device 410 when a connection is made between modular computing device 410 and the modular component 430.

Similar to the modular computing device 410, a modular component 430 can include one or more processor(s) 432 and/or a memory 434. The one or more processor(s) 432 can include one or more central processing units (CPUs), graphics processing units (GPUs) dedicated to efficiently rendering images or performing other specialized calculations, and/or other processing devices. The memory 434 can include one or more computer-readable media and can store information accessible by the one or more processors 432, including instructions 436 that can be executed by the one or more processors 432 and data 438. For instance, the memory 434 can store instructions 436 for determining configuration parameters associated with modular computing device 410, and for implementing various functionalities that can be contributed to modular computing device 410.

The modular component 430 of FIG. 8 can include various input/output devices for providing and receiving information from a user, such as a touch screen, touch pad, data entry keys, speakers, and/or a microphone suitable for voice recognition. For instance, the modular component 430 can have a display device 435 for presenting a user interface according to example aspects of the present disclosure.

The modular component 430 can also include a network interface used to communicate with one or more remote computing devices (e.g. modular computing device 410) over a network. The network interface can include any suitable components for interfacing with one more networks, including for example, transmitters, receivers, ports, controllers, antennas, or other suitable components.

The network can be any type of communications network, such as a local area network (e.g. intranet), wide area network (e.g. Internet), cellular network, or some combination thereof. The network can also include a direct connection between a modular component 430 and the modular computing device 410. In general, communication between the modular computing device 410 and a modular component 430 can be carried via network interface using any type of wired and/or wireless connection, using a variety of communication protocols (e.g. TCP/IP, HTTP, SMTP, FTP), encodings or formats (e.g. HTML, XML), and/or protection schemes (e.g. VPN, secure HTTP, SSL).

Modular computing device 410 and modular component 430 can further include one or more connection devices 440 that can facilitate a connection between modular computing device 410 and modular component 430. The connection device(s) 440 can include a plurality of connector elements having an antenna element and one or more connector pins. In various implementations, the connection device(s) 440 can facilitate a physical connection and/or a wireless connection through direct wireless communication and/or communication over the network.

The technology discussed herein makes reference to servers, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, server processes discussed herein may be implemented using a single server or multiple servers working in combination. Databases and applications may be implemented on a single system or distributed across multiple systems. Distributed components may operate sequentially or in parallel.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A computer-implemented method of controlling operation of a connection device associated with a modular computing system, the method comprising:

obtaining, by the one or more computing devices, data indicative of an establishment of a connection between a first connection device and a second connection device, the first connection device being associated with a modular computing device, the second connection device being associated with a first modular component to be implemented within the modular computing device, each connection device comprising a plurality of connector elements;

obtaining, by the one or more computing devices, data indicative of one or more configuration parameters associated with the second connection device;

determining, by the one or more computing devices, an operating configuration of the first connection device based at least in part on the data indicative of the one or more configuration parameters associated with the second connection device, wherein determining the operating configuration includes determining a first operating configuration of a connector element of the first connection device based on a configuration parameter associated with a corresponding connector element of the second connection device;

configuring the connector element of the first connection device to only communicate using a power signal type in response to the configuration parameter associated with the corresponding connector element of the second connection device;

obtaining, by the one or more computing devices, data indicative of an establishment of a connection between the first connection device and a third connection device, the third connection device being associated with a second modular component to be implemented within the modular computing device, the third connection device comprising a plurality of connector elements;

obtaining, by the one or more computing devices, data indicative of one or more configuration parameters associated with the third connection device;

wherein determining the operating configuration of the first connection device comprises determining a second operating configuration of the connector element of the first connection device based on a configuration parameter associated with a corresponding connector element of the third connection device; and configuring the connector element of the first connection device to only communicate using a data signal type in response to the configuration parameter associated with the corresponding connector element of the third connection device.

2. The computer-implemented method of claim 1, wherein each connector element comprises an antenna element configured to communicate with an antenna element associated with a corresponding connector element of an additional connection device.

3. The computer-implemented method of claim 2, wherein each antenna element is configured to communicate using one or more wireless communication techniques, and wherein the antenna elements associated with the first connection device do not make physical contact with the corresponding antenna elements associated with the second connection device during the connection between the first connection device and the second connection device.

4. The computer-implemented method of claim 2, wherein each connector element comprises a plurality of connector pins, each connector pin configured to interface with a corresponding connector pin associated with a connector element of an additional connection device.

5. The computer-implemented method of claim 1, wherein the data indicative of the establishment of the connection between the first connection device and the second connection device comprises data indicative of at least a subset of connector elements of the first connection device to which the second connection device is connected.

6. The computer-implemented method of claim 5, wherein the data indicative of the at least a subset of connector elements comprises an identifier associated with each connector element in the at least a subset.

7. The computer-implemented method of claim 5, wherein determining, by the one or more computing devices, an operating configuration of the first connection device comprises determining one or more tasks to be performed by at least a subset of connection elements of the first connection device.

8. The computer-implemented method of claim 1, wherein each connector element of the first connection device and the second connection device is individually configurable.

9. The computer-implemented method of claim 1, wherein the connection between the first connection device and the second connection device comprises a physical connection.

10. The computer-implemented method of claim 1, wherein connecting the modular component to the modular computing device comprises positioning the modular component within a receptacle associated with a frame of the modular computing device, such that at least a portion of the first connection device makes physical contact with at least a portion of the second connection device.

11. The computer-implemented method of claim 1, wherein:
the first connection device includes a first antenna element; and
obtaining data indicative of one or more configuration parameters comprises receiving the data wirelessly using the first antenna element.

12. A modular computing device comprising:
a connection device comprising a plurality of connector elements, each connector element comprising an antenna element and at least one connector pin;
one or more control devices configured to control operation of the connection device by:
obtaining data indicative of an establishment of a connection between the connection device and a first mating connection device associated with a first modular component, the first mating connection device being associated with a first modular component to be implemented within the modular computing device;
obtaining data indicative of one or more configuration parameters associated with the first mating connection device;
determining an operating configuration of the connection device based at least in part on the data indicative of the one or more configuration parameters associated with the first mating connection device, wherein determining the operating configuration includes determining a first operating configuration of a connector element of the connection device based on a configuration parameter associated with a corresponding connector element of the first mating connection device;
configuring the connector element of the connection device to only communicate using a power signal type in response to the configuration parameter associated with the corresponding connector element of the first mating connection device;
obtaining, by the one or more computing devices, data indicative of an establishment of a connection between the connection device and a second mating connection device, the second mating connection device being associated with a second modular component to be implemented within the modular computing device, the second mating connection device comprising a plurality of connector elements;
obtaining, by the one or more computing devices, data indicative of one or more configuration parameters associated with the second mating connection device;

wherein determining the operating configuration of the connection device comprises determining a second operating configuration of the connector element of the connection device based on a configuration parameter associated with a corresponding connector element of the second mating connection device; and configuring the connector element of the connection device to only communicate using a data signal type in response to the configuration parameter associated with the corresponding connector element of the second mating connection device.

13. The modular computing device of claim 12, wherein each antenna element is configured to wirelessly communicate with an antenna element associated with a corresponding connector element of the mating connection device, and wherein the antenna elements of the connection device do not make physical contact with the corresponding antenna elements of the mating connection device.

14. The modular computing device of claim 12, wherein the connection device further comprises a latching structure configured to facilitate a physical connection of the connection device and the mating connection device.

15. One or more tangible, non-transitory computer-readable media storing computer-readable instructions that when executed by one or more processors cause the one or more processors to perform operations, the operations comprising:

obtaining data indicative of an establishment of a connection between a first connection device and a second connection device, the first connection device being associated with a modular computing device, the second connection device being associated with a first modular component to be implemented within the modular computing device, each connection device comprising a plurality of connector elements;

obtaining data indicative of one or more configuration parameters associated with the second connection device;

determining an operating configuration of the first connection device based at least in part on the data indicative of the one or more configuration parameters associated with the second connection device, wherein determining the operating configuration includes determining a first operating configuration of a connector element of the first connection device based on a configuration parameter associated with a corresponding connector element of the second connection device;

configuring the connector element of the first connection device to only communicate using a data signal type having a first frequency in response to the configuration parameter associated with the corresponding connector element of the second connection device;

obtaining, by the one or more computing devices, data indicative of an establishment of a connection between the first connection device and a third connection device, the third connection device being associated with a second modular component to be implemented within the modular computing device, the third connection device comprising a plurality of connector elements;

obtaining, by the one or more computing devices, data indicative of one or more configuration parameters associated with the third connection device;

wherein determining the operating configuration of the first connection device comprises determining a second operating configuration of the connector element of the first connection device based on a configuration parameter associated with a corresponding connector element of the third connection device; and configuring the connector element of the first connection device to only communicate using a data signal type having a second frequency in response to the configuration parameter associated with the corresponding connector element of the third connection device, the first frequency and the second frequency are different.

* * * * *